United States Patent [19]
Nagata

[11] Patent Number: 6,009,020
[45] Date of Patent: Dec. 28, 1999

[54] SEMICONDUCTOR MEMORY DEVICE HAVING DYNAMIC DATA AMPLIFIER CIRCUIT CAPABLE OF REDUCING POWER DISSIPATION

[75] Inventor: Kyoichi Nagata, Tokyo, Japan

[73] Assignee: NEC Corporation, Tokyo, Japan

[21] Appl. No.: 09/266,731

[22] Filed: Mar. 12, 1999

[30] Foreign Application Priority Data

Mar. 13, 1998 [JP] Japan .................................. 10-062636

[51] Int. Cl.⁶ .................................................. G11C 7/00
[52] U.S. Cl. .................... 365/189.05; 365/207; 365/208; 365/194
[58] Field of Search .............................. 365/189.05, 207, 365/208, 194

[56] References Cited

U.S. PATENT DOCUMENTS 5,473,576  12/1995  Matsui ...................................... 365/207
5,619,466  4/1997  McClure .................................. 365/207

FOREIGN PATENT DOCUMENTS 6-349274  12/1994  Japan .

Primary Examiner—Vu A. Le
Attorney, Agent, or Firm—Sughrue, Mion, Zinn, Macpeak & Seas, PLLC

[57] ABSTRACT

In a semiconductor memory device including a pair of data input/output lines, a data amplifier circuit amplifies voltages at the data input/output lines, and a data maintaining circuit maintains output signals of the data amplifier circuit. A data determination circuit, generates a data determination signal after the data maintaining circuit manintains the output signals of the data amplifier circuit and transmits the data transmitting the data determination signal to the data amplifier circuit, thus suspending the operation of the data amplifier circuit.

10 Claims, 9 Drawing Sheets

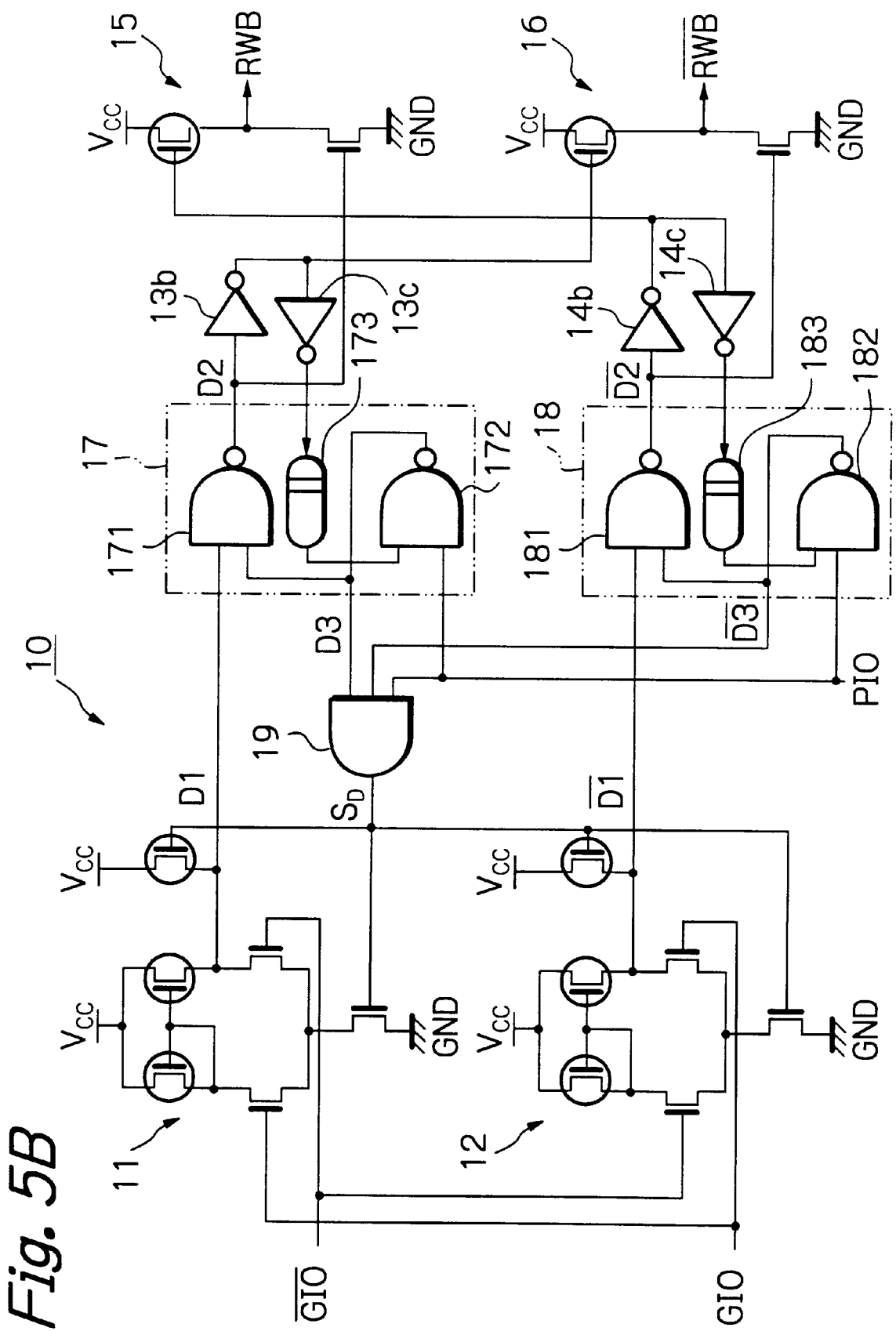

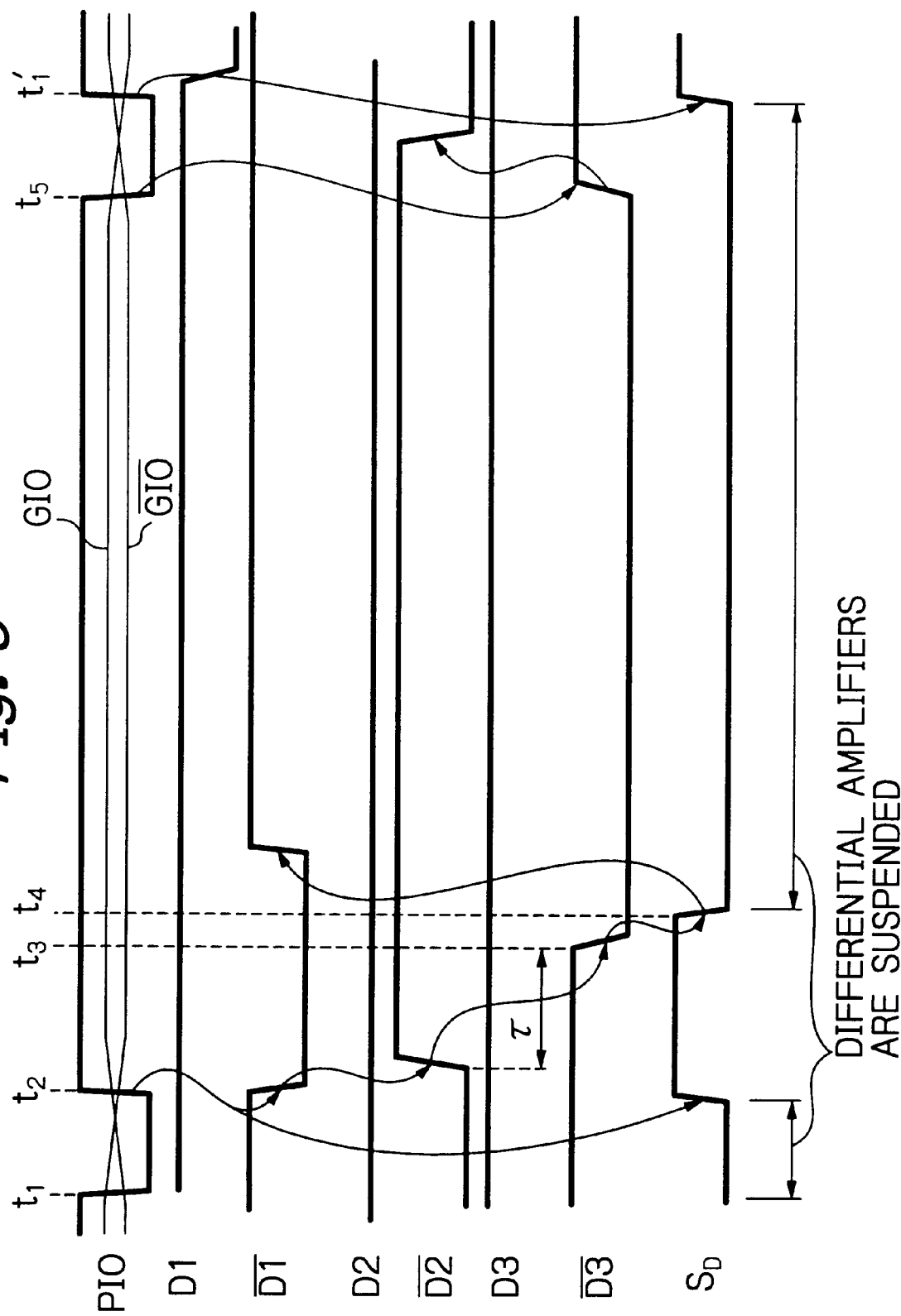

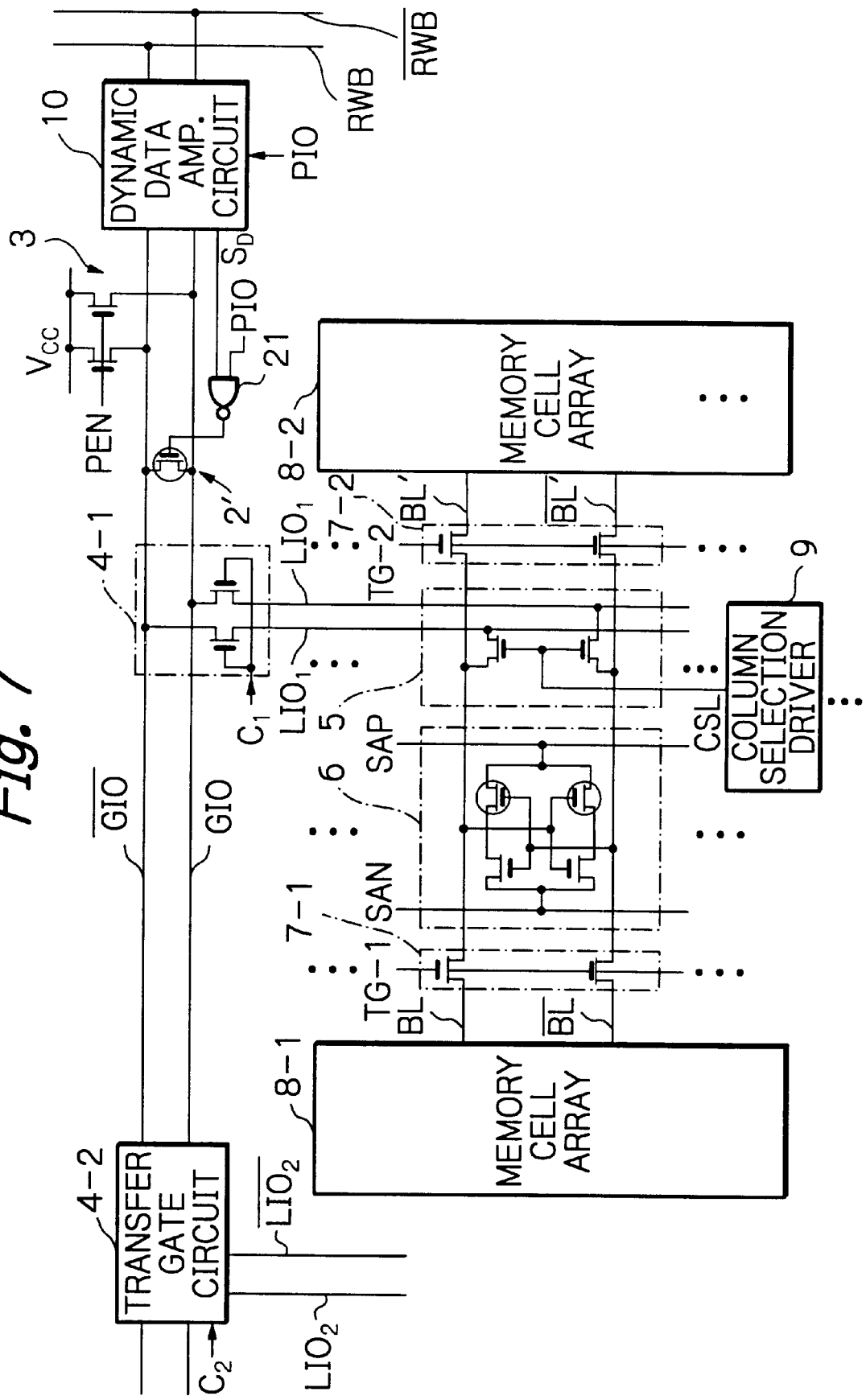

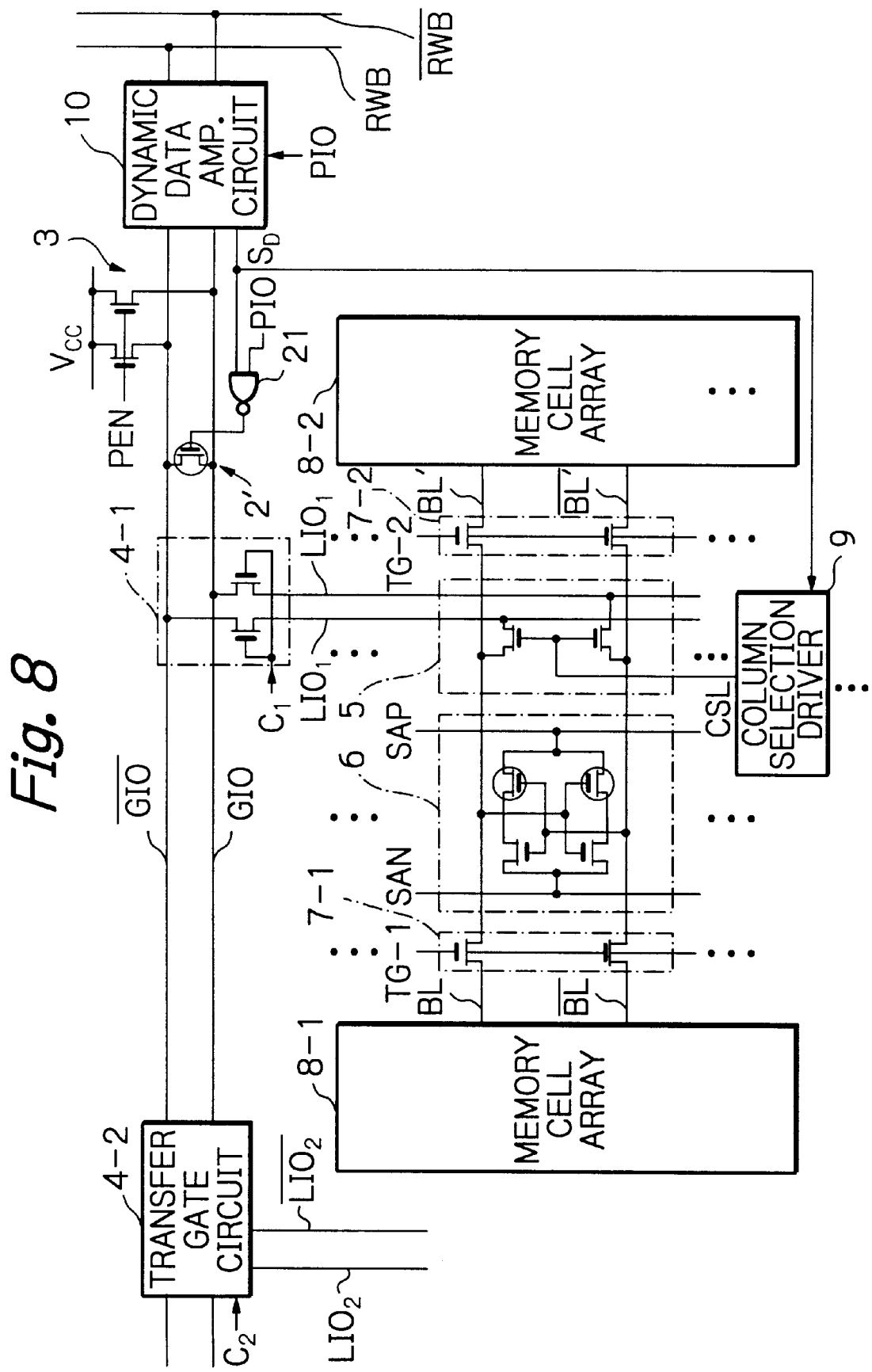

SEMICONDUCTOR MEMORY DEVICE HAVING DYNAMIC DATA AMPLIFIER CIRCUIT CAPABLE OF REDUCING POWER DISSIPATION

BACKGROUND OF THE INVENTION

1. Field of the Invention

The present invention relates to a semiconductor memory device such as a dynamic random access memory (DRAM) device, and more particularly, to the dynamic data amplifier circuit thereof.

2. Description of the Related Art

Generally, in a DRAM device, a dynamic data amplifier circuit is connected to data input/output lines to amplify the difference in voltage therebetween.

A prior art dynamic data amplifier circuit is constructed by current mirror type differential amplifiers. This will be explained later in detail.

In the above-described prior art DRAM device, however, even after the output signals of the differential amplifiers are determined, the differential amplifiers are still enabled. As a result, the power dissipation is increased. Particularly, in a 1Gbit DRAM device, this increase in the power dissipation cannot be ignored.

SUMMARY OF THE INVENTION

It is an object of the present invention to reduce the power dissipation of a dynamic data amplifier circuit in a semiconductor memory device.

According to the present invention, in a semiconductor memory device including a pair of data input/output lines, a data amplifier circuit amplifies voltages at the data input/output lines, and a data maintaining circuit maintains output signals of the data amplifier circuit. A data determination circuit generates a data determination signal after the data maintaining circuit maintains the output signals of the data amplifier circuit and transmits the data transmitting the data determination signal to the data amplifier circuit, thus suspending the operation of the data amplifier circuit.

BRIEF DESCRIPTION OF THE DRAWINGS

The present invention will be more clearly understood from the description set forth below, as compared with the prior art, with reference to the accompanying drawings, wherein:

FIG. 5B is a circuit diagram illustrating a modification of the circuit of FIG. 5B;

FIG. 6 is a timing diagram showing the operation of the dynamic data amplifier circuit of FIG. 5A (5B);

FIG. 7 is a circuit diagram illustrating a second embodiment of the semiconductor memory device according to the present invention; and FIG. 8 is a circuit diagram illustrating a third embodiment of the semiconductor memory device according to the present invention.

DESCRIPTION OF THE PREFERRED EMBODIMENTS

Before the description of the preferred embodiments, a prior art semiconductor memory device will be explained with reference to FIGS. 1, 2 and 3.

Figure 1:
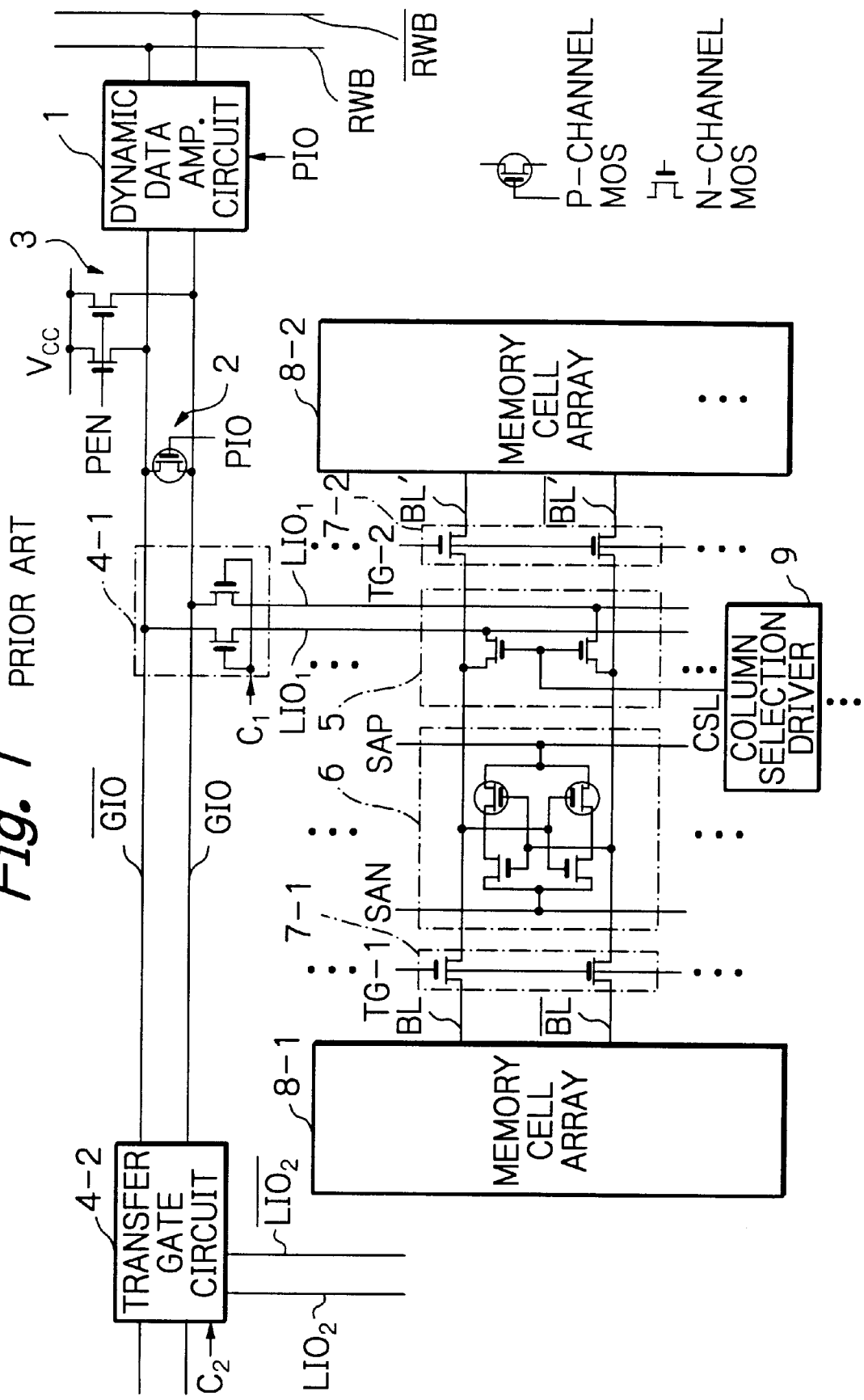
FIG. 1 is a circuit diagram illustrating a prior art semiconductor memory device.

In FIG. 1, which illustrates a prior art DRAM device, global input/output lines GIO and $\overline{\text{GIO}}$ are connected to a dynamic data amplifier circuit 1 which is connected to read/write bus lines RWB and $\overline{\text{RWB}}$. Also, an equalizer 2 formed by a P-channel MOS transistor is connected to the global input/output lines GIO and $\overline{\text{GIO}}$. That is when a precharging signal PIO is made low, the equalizer 2 is turned ON to equalize the voltages at the global input/output lines GIO and $\overline{\text{GIO}}$. Further, a clamp circuit 3 formed by two N-channel MOS transistors is connected to the global input/output lines GIO and $\overline{\text{GIO}}$. That is, when a clamp enable signal PEN is made high, the clamp circuit 3 is turned ON to clamp the voltages at the global input/output lines GIO and $\overline{\text{GIO}}$.

Additionally, a plurality of pairs of local input/output lines $LIO_1$, and $\overline{LIO_1}$, $LIO_2$, and $\overline{LIO_2}$, ... are connected by transfer gate circuits 4-1, 4-2, ... to the global input/output lines GIO and GIO. For example, when a control signal $C_1$ is made high, the local input/output lines $LIO_1$ and $\overline{LIO_1}$ are connected to the global input/output lines GIO and $\overline{\text{GIO}}$, respectively.

Each pair of the local input/output lines such as $LIO_1$ and $\overline{LIO_1}$, are connected to a memory bank which is constructed by column selection circuits 5, sense amplifiers 6 each connected to one of the column selection circuit 5, local transfer gate circuits 7-1 and 7-2, and memory cell arrays 8-1 and 8-2, and column selection drivers 9. Each of the column selection circuits 5 is operated by a column selection signal CSL generated from one of the column selection drivers 9 which are operated by a column decoder (not shown). Also, the sense amplifiers 6 are enabled by two sense amplifier enable signals SAP and SAN. Further, one of the transfer gate circuits 7-1 and 7-2 is operated by control signals TG-1 and TG-2, so that either the bit lines BL and $\overline{\text{BL}}$ of the memory cell array 8-1 or the bit lines BL' and $\overline{\text{BL'}}$ of the memory cell array 8-2 are connected to the sense amplifiers 6.

Figure 2:
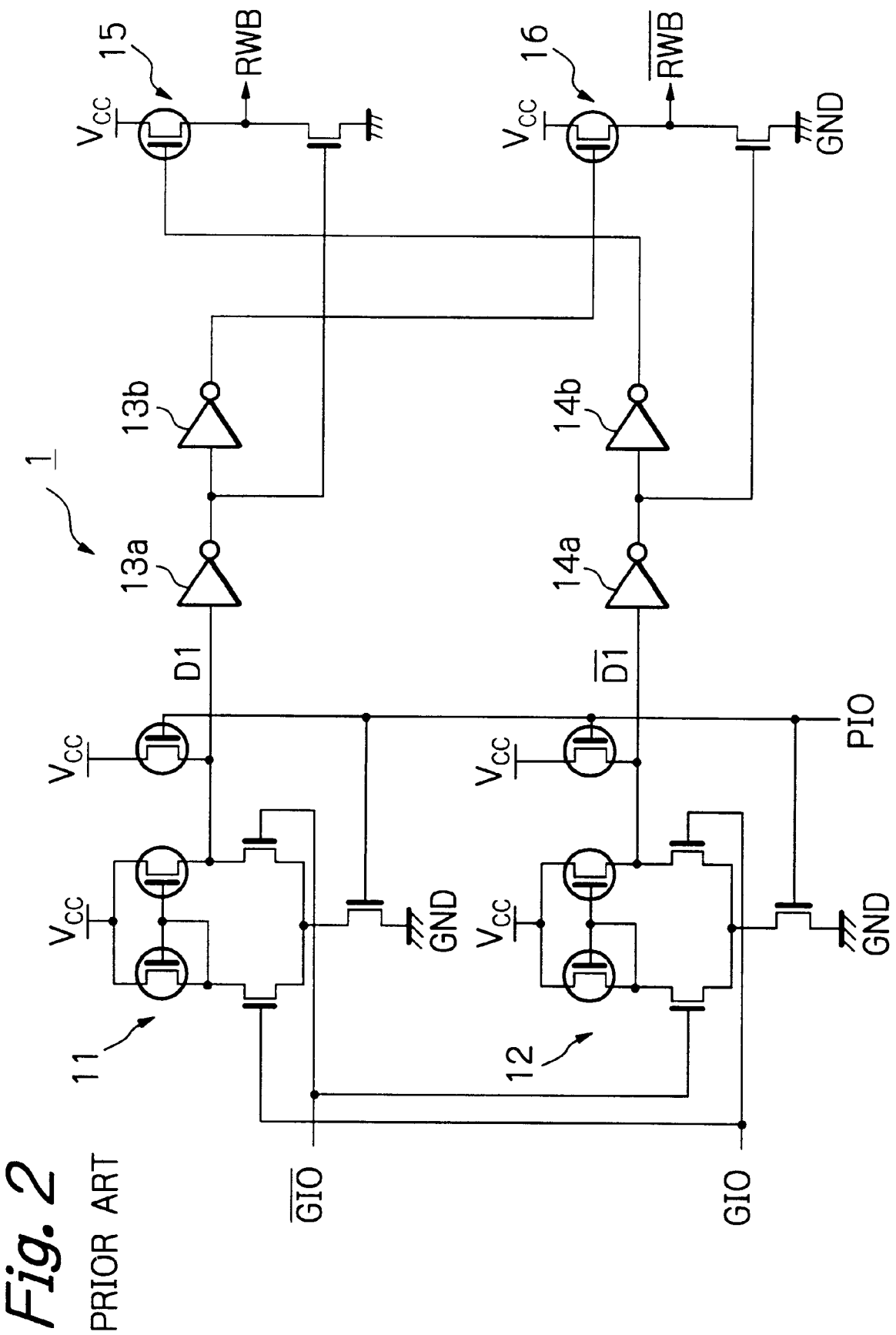
FIG. 2 is a circuit diagram of the dynamic data amplifier circuit of FIG. 1.

In FIG. 2, which is a detailed circuit diagram of the dynamic data amplifier 1 of FIG. 1, a current mirror type differential amplifier 11 is provided for amplifying the difference between the voltages at the global input/output lines GIO and $\overline{\text{GIO}}$. Also, a current mirror type differential amplifier 12 is provided for amplifying the difference between the voltages at the global input/output lines $\overline{\text{GIO}}$ and GIO. The output signal D1 and $\overline{\text{D1}}$ of the differential amplifiers 11 and 12 are supplied to inverters 13a, 13b, 14a and 14b which control read/write bus drivers 15 and 16 each formed by a p-channel MOS transistor and an N-channel MOS transistor, thus controlling the voltages at the read/write bus line RWB and $\overline{\text{RWB}}$.

The differential amplifiers 11 and 12 are enabled and disabled by the precharging signal PIO.

The operation of the dynamic data amplifier circuit 1 of FIG. 2 is explained next with reference to FIG. 3. Here, assume that the transfer gate circuit 4-1, the column selection circuit 5 and the transfer gate circuit 7-1 of FIG. 1 are operated, so that data is transmitted from the memory cell array 8-1 to the global input/output lines GIO and $\overline{\text{GIO}}$.

First, at time $t_1$, when the precharging signal PIO is switched from high to low, the control enters a precharging mode, so that the voltages at the global input/output lines GIO and $\overline{\text{GIO}}$ are equalized. In this case, the clamp circuit 3 is also operated by the clamp enable signal PEN in synchronization with the precharging signal PIO. Also, the differential amplifiers 11 and 12 are disabled by the precharging signal PIO, so that the output signals D1 and $\overline{\text{D1}}$ of the differential amplifiers 11 and 12 are both made high.

Next, at time $t_2$, when the precharging signal PIO is switched from low to high, the control is moved from the precharging mode to a data amplifier circuit operation mode. That is, the differential amplifiers 11 and 12 are enabled by the precharging signal PIO, so that only one of the output signals such as $\overline{\text{D1}}$ becomes low. Therefore, one of the read/write bus lines such as $\overline{\text{RWB}}$ becomes low. This state continues before the precharging signal is switched from high to low at time $t_3$.

In the dynamic data amplifier circuit 1 of FIGS. 1 and 2, however even after the output signals D1 and $\overline{\text{D1}}$ of the differential amplifiers 11 and 12 are determined at time $t_0$, for example, the differential amplifiers 11 and 12 are still enabled by the precharging signal PIO from time $t_3$ to time $t_4$ which increases the power dissipation. In other words, the operation of the differential amplifiers 11 and 12 is suspended only for a time period from time $t_1$ to time $t_2$.

Figure 4:
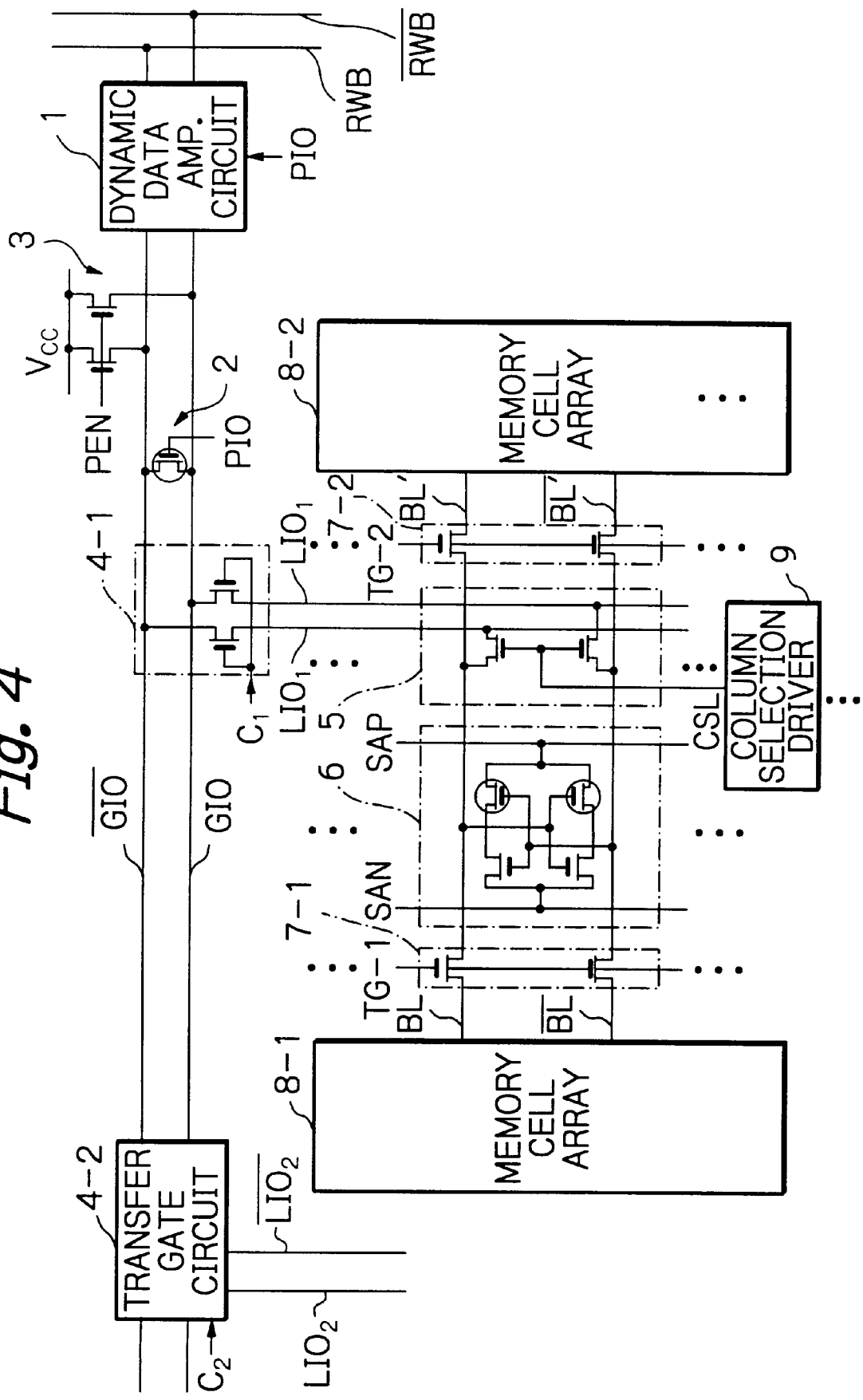
FIG. 4 is a circuit diagram illustrating a first embodiment of the semiconductor memory device according to the present invention.

In FIG. 4, which illustrates a first embodiment of the present invention, a dynamic data amplifier circuit 10 is provided instead of the dynamic data amplifier circuit 1 of FIG. 1.

Figure 5A:
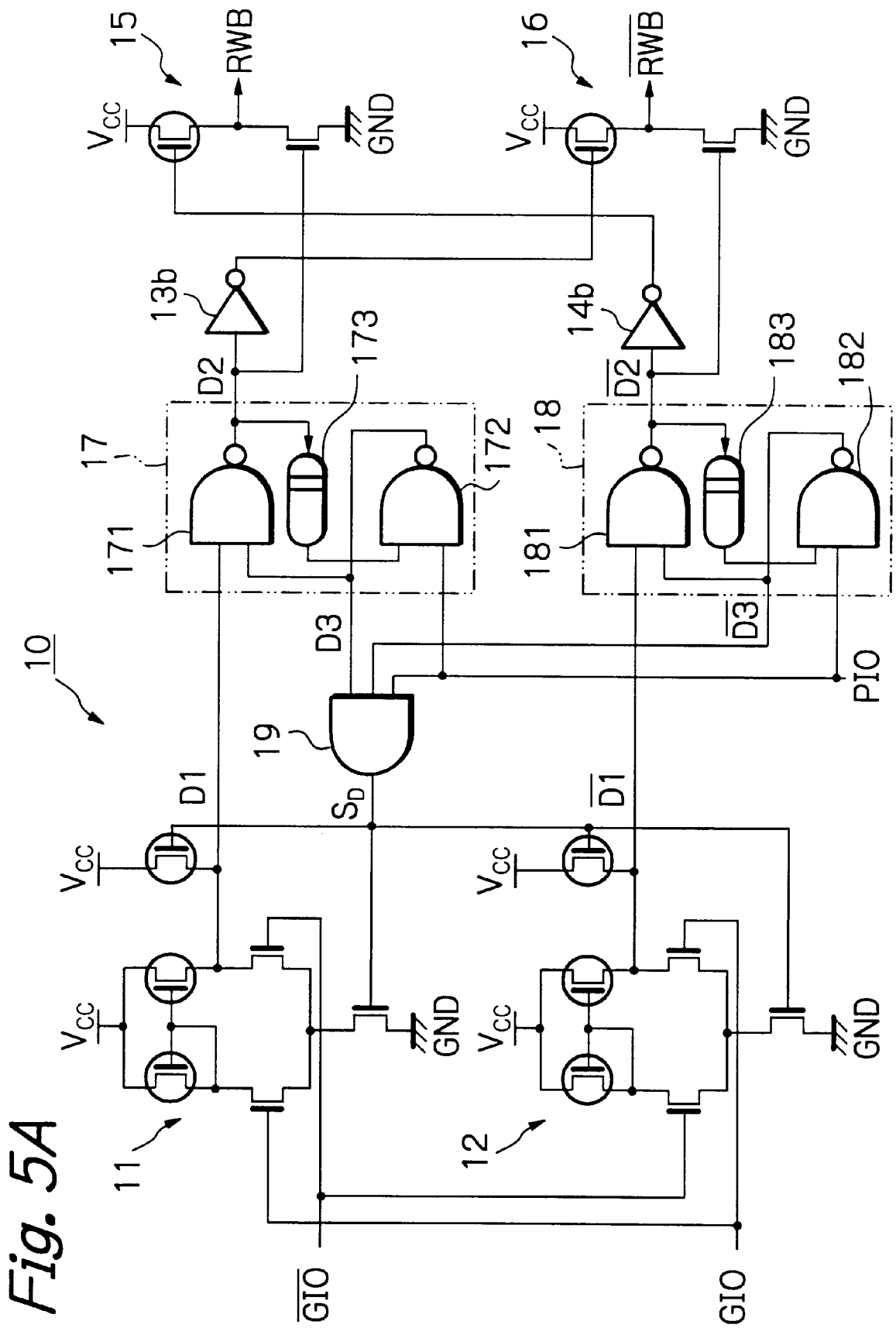
FIG. 5A is a circuit diagram of the dynamic data amplifier circuit of FIG. 4.

The dynamic data amplifier circuit 10 of FIG. 4 is illustrated in detail in FIG. 5A. That is, flip-flops 17 and 18 as data maintaining means are provided instead of the inverters 13a and 14a, respectively, of FIG. 2. Also, an AND circuit 19 as a data determination signal generating means is connected to the flip-flops 17 and 18. The AND circuit 19 also receives the precharging signal PIO.

The differential amplifiers 11 and 12 are enabled and disabled by a data determination signal $S_D$ generated from the AND circuit 19, not by the precharging signal PIO.

In more detail, the flip-flip 17 is constructed by two cross-coupled NAND circuits 171 and 172 where the output signal D2 of the NAND circuit 171 is supplied via a delay circuit 173 to an input of the NAND circuit 172 while the output signal D3 of the NAND circuit 172 is supplied directly to an input of the NAND circuit 171. Another input of the NAND circuit 171 as a set terminal of the flip-flop 17 receives the output signal D1 of the differential amplifier 11, and another input of the NAND circuit 172 as a reset terminal of the flip-flop 17 receives the precharging signal PIO.

On the other hand, the flip-flip 18 is constructed by two cross-coupled NAND circuits 181 and 182 where the output signal D2 of the NAND circuit 181 is supplied via a delay circuit 183 to an input of the NAND circuit 182 while the output signal D3 of the NAND circuit 182 is supplied directly to an input of the NAND circuit 181. Another input of the NAND circuit 181 as a set terminal of the flip-flop 18 receives the output signal D1 of the differential amplifier 12, and another input of the NAND circuit 182 as a reset terminal of the flip-flop 18 receives the precharging signal PIO.

Note that, as illustrated in FIG. 5B, if the delay circuit 173 (183) is connected via the inverter 13b (14b) and an inverter 13c (14c) to the NAND circuit 171 (181), the delay circuit 173 (183) can be decreased in size.

The operation of the dynamic data amplifier circuit 1 of FIG. 5A (5B) is explained next with reference to FIG. 6. Also here, assume that the transfer gate circuit 4-1, the column selection circuit 5 and the transfer gate circuit 7-1 of FIG. 4 are operated, so that data is transmitted from the memory cell array 8-1 to the global input/output lines GIO and $\overline{\text{GIO}}$.

First, at time $t_1$, when the precharging signal PIO is switched from high to low, the control enters a precharging mode, so that the voltages at the global input/output lines GIO and $\overline{\text{GIO}}$ are equalized. In this case, the clamp circuit 3 is also operated by the clamp enable signal PEN in synchronization with the precharging signal PIO. Also, the data determination signal $S_D$ is made low by the precharging signal PIO, so that the differential amplifiers 11 and 12 are disabled by the data determination signal $S_D$. Therefore, the output signals D1 and $\overline{\text{D1}}$ of the differential amplifiers 11 and 12 are both made high. In this case, note that since the output signals D3 and $\overline{\text{D3}}$ of the NAND circuits 172 and 182 are both high, the output signals D1 and $\overline{\text{D1}}$ of the differential amplifiers 11 and 12 make the output signals D2 and $\overline{\text{D2}}$ of the NAND circuits 171 and 181 low.

Next, at time $t_2$, when the precharging signal PIO is switched from low to high, the control is moved from the precharging mode to a data amplifier circuit operation mode. That is, the data determination signal $S_D$ is switched from low to high, so that the ditterential amplifiers 11 and 12 are enabled by the data determination signal $S_D$. Therefore, only one of the output signals such as $\overline{\text{D1}}$ becomes low. so that the output signal $\overline{\text{D2}}$ of the NAND circuit 181 becomes high, which turns ON the read/write bus driver 16.

Next, at time $t_3$, after a time period τdefined by the delay circuit 183 has passed, the output signal $\overline{\text{D2}}$ of the NAND circuit 181 reaches the NAND circuit 183, so that the output signal $\overline{\text{D3}}$ of the NAND circuit 183 becomes low, thus switching the data determination signal $S_D$ from high to low at time $t_4$.

When the data determination signal $S_D$ is switched from high to low, the differential amplifiers 11 and 12 are disabled, and accordingly, the output signal $\overline{\text{D1}}$ of the differential amplifier 12 is switched from low to high.

In the dynamic data amplifier circuit 10 of FIGS. 4 and 5, after the output signals D1 and $\overline{\text{D1}}$ of the differential amplifiers 11 and 12 are determined at time $t_4$, the differential amplifiers 11 and 12 are disabled by the data determination signal $S_D$ from time $t_4$ to time $t_5$, which decreases the power dissipation. In other words, the operation of the differential amplifiers 11 and 12 is suspended for a time period from time $t_4$ to time $t_1'$ before the precharging signal PIO is again switched from low to high.

In FIG. 7, which illustrates a second embodiment of the present invention, an equalizer 2' formed by an N-channel MOS transistor is provided instead of the equalizer 2 of FIG. 4, and a NAND circuit 21 for controlling the equalizer 2' is added to the elements of FIG. 4. The NAND circuit 21 receives the data determination signals $S_D$ from the dynamic data amplifier circuit 10 in addition to the precharging signal PIO. Therefore, when the operation of the differential amplifiers 11 and 12 of the dynamic data amplifier circuit 10 is suspended, the global input/output lines GIO and $\overline{\text{GIO}}$ are equalized to stabilize the operation of the dynamic data amplifier circuit 10.

In FIG. 8, which illustrates a third embodiment of the present invention, the data determination signal $S_D$ of FIG. 7 is also supplied to the column selection drivers 9. When the data determination signal $S_D$ is low, the operation of the column selection circuit 5 is unnecessary. Therefore, in this case, the operation of the column selection drivers 9 is suspended to stop the operation of the column seleciton circuits 5. As a result, penetration currents flowing from the clamp circuit 3 via the column selection circuits 5 to the sense amplifiers 6 are shut down, which further decreases the power dissipation.

As explained hereinabove, according to the present invention, since the operation of the differential amplifiers of the dynamic data amplifier circuit is suspended by a data determination signal generated in the dynamic data amplifier circuit, the power dissipation can be decreased.

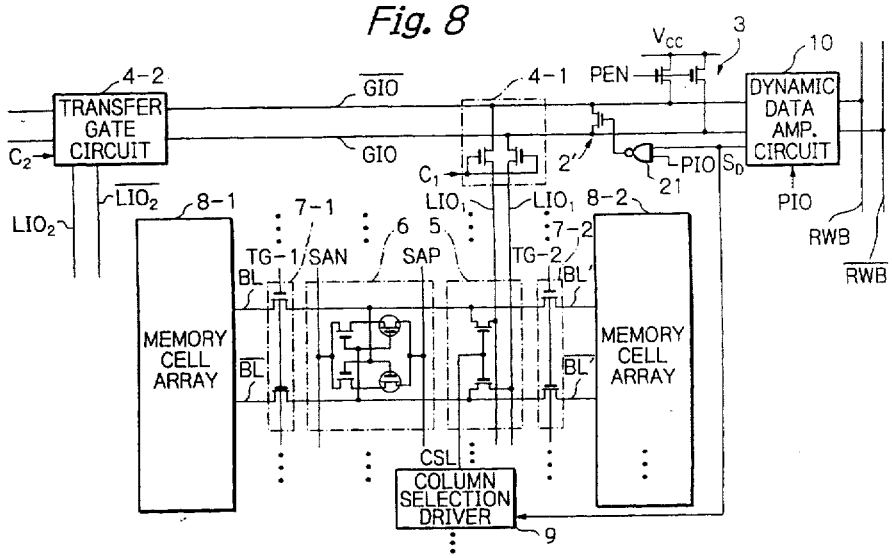

I claim:

1. A semiconductor memory device comprising:
   a pair of data input/output lines;
   a data amplifier circuit, connected to said data input/output lines, for amplifying voltages at said data input/output lines;
   a data maintaining circuit, connected to said data amplifier circuit, for maintaining output signals of said data amplifier circuit; and
   a data determination circuit, connected between said data maintaining circuit and said data amplifier circuit, for generating a data determination signal after said data maintaining circuit maintains the output signals of said data amplifier circuit and transmitting said data determination signal to said data amplifier circuit, so that an operation of said data amplifier circuit is suspended.

2. The device as set forth in claim 1, wherein said data determination circuit generates said data determination signal when a definite time period has passed after said data maintaining circuit maintains the output signals of said data amplifier circuit.

3. The device as set forth in claim 1, wherein said data maintaining circuit and said data determination circuit are reset by receiving a precharging signal.

4. The device as set forth in claim 1, wherein said data amplifier circuit comprises:
   a first current mirror type differential amplifier for amplifying a first difference between the output voltages of said data input/output lines; and
   a second current mirror type differential amplifier for amplifying a second difference opposite to said first difference between the output voltages of said data input/output lines,
   said first and second current mirror type differential amplifiers being operated by said data determination circuit.

5. The device as set forth in claim 3, wherein said data maintaining circuit comprises:

a first flip-flop connected to an output of said first current mirror type differential amplifier and having a set terminal for receiving an output signal of said first current mirror type differential amplifier and a reset terminal for receiving a precharging signal; and a second flip-flop connected to an output of said second current mirror type differential amplifier and having a set terminal for receiving an output signal of said second current mirror type differential amplifier and a reset terminal for receiving said precharging signal.

6. The device as set forth in claim 5, wherein each of first and second flip-flops comprises:
   a first NAND circuit having a first input connected to said set terminal and a second input;
   a delay circuit connected to an output of said first NAND circuit; and
   a second NAND circuit having a first input for receiving said precharging signal and a second input connected to said delay circuit.

7. The device as set forth in claim 6, wherein said data determination circuit is connected to outputs of said second NAND circuits of said first and second flip-flops.

8. The device as set forth in claim 6, wherein said data determination circuit comprises an AND circuit having first and second inputs connected to outputs of said second NAND circuits of said first and second flip-flops, respectively, and a third input for receiving said precharging signal.

9. The device as set forth in claim 1, further comprising:
   an equalizer, connected to said data input/output lines, for equalizing the voltages at said data input/output lines; and
   a control circuit, connected to said data determination circuit and said equalizer, for operating said equalizer in accordance with said data determination signal and said precharging signal.

10. The device as set forth in claim 1, further comprising:
   memory cells;
   column selection circuits, operatively connected to said data input/output lines, for transmitting data from said memory cells to said data input/output lines; and
   column selection drivers, each connected to said data determination circuit and one of said column selection circuits, for driving said column selection circuits,
   said column selection drivers being operated in accordance with said data determination signal.

* * * * *

UNITED STATES PATENT AND TRADEMARK OFFICE
CERTIFICATE OF CORRECTION

PATENT NO. : 6,009,020  
DATED : December 28, 1999  
INVENTOR(S) : Kyoichi NAGATA Page 1 of 3

Figure 3:
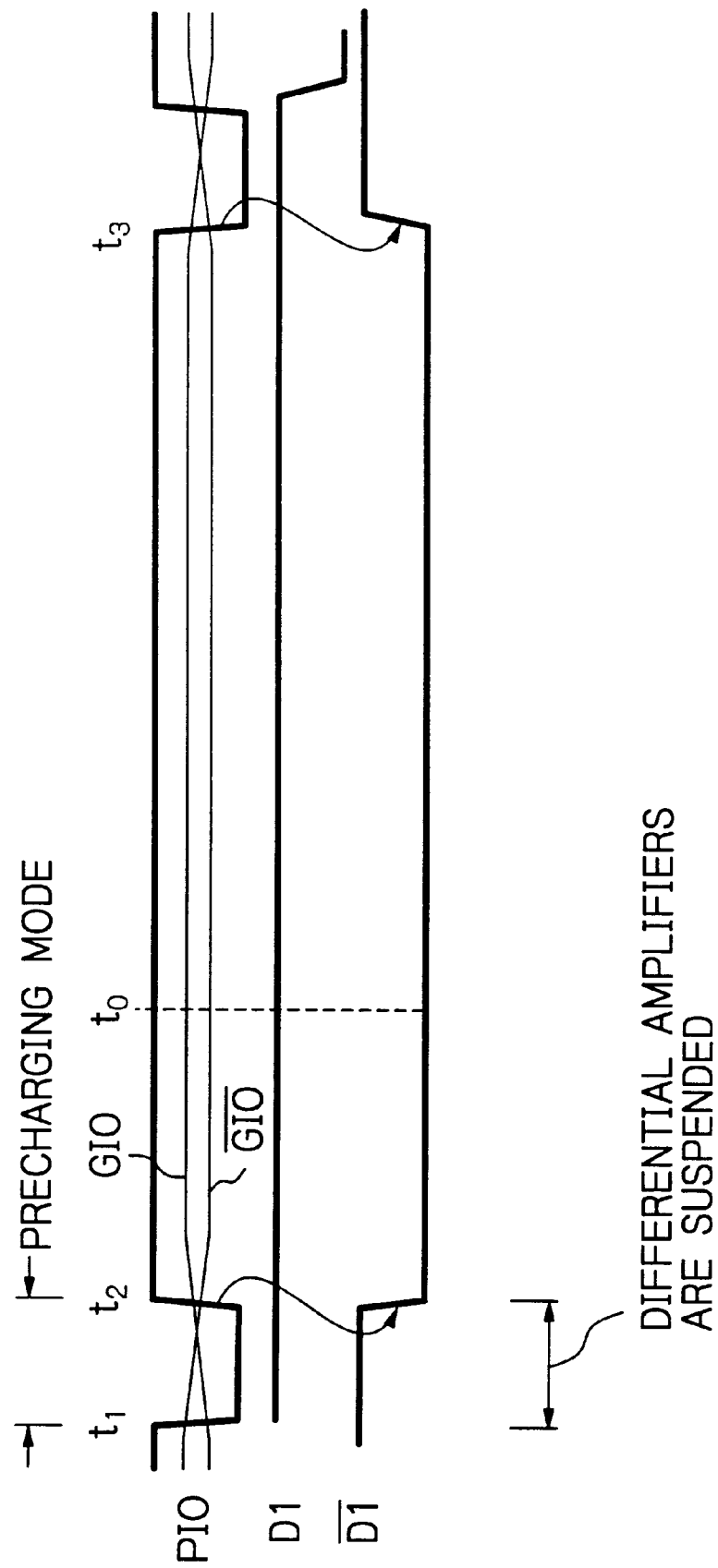
FIG. 3 is a timing diagram showing the operation of the dynamic data amplifier circuit of FIG. 2.

It is certified that error appears in the above-identified patent and that said Letters Patent is hereby corrected as shown below:

In the drawings, Sheet 3, Fig. 3, should identify time $t_4$ as indicated in the amended drawings filed July 15, 1999.

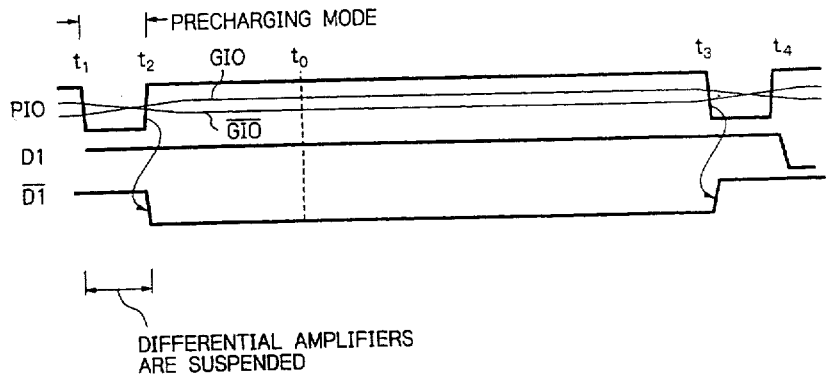

Signed and Sealed this

Twenty-eighth Day of November, 2000

Attest:

Q. TODD DICKINSON

Attesting Officer

Director of Patents and Trademarks

UNITED STATES PATENT AND TRADEMARK OFFICE
CERTIFICATE OF CORRECTION

PATENT NO. 6,009,020
DATED     December 28, 1999
INVENTOR(S) Kyoichi NAGATA

It is certified that error appears in the above-identified patent and that said Letters Patent is hereby corrected as shown below:

In the drawings, Sheet 8, Fig. 7, should illustrate the N-channel transistor 2' as shown below and as indicated in the amended drawings filed July 15, 1999.

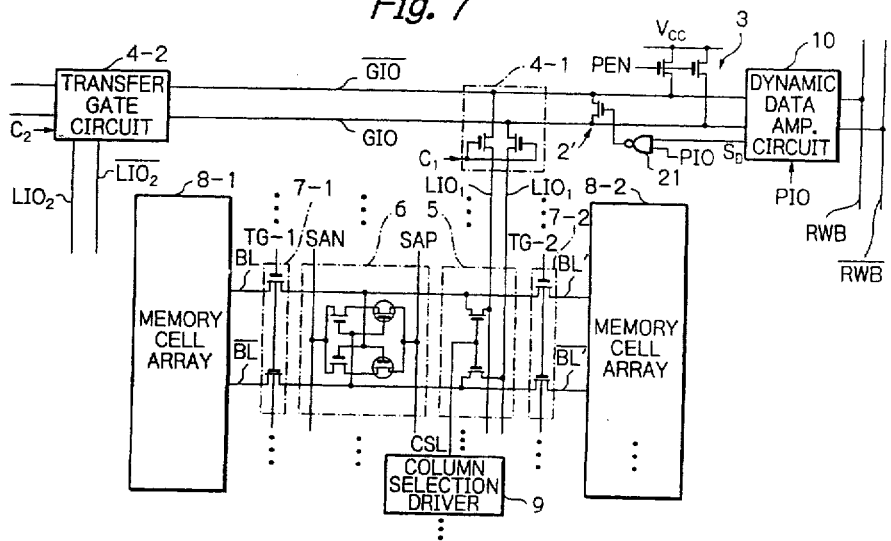

UNITED STATES PATENT AND TRADEMARK OFFICE
CERTIFICATE OF CORRECTION

PATENT NO. : 6,009,020
DATED : December 28, 1999
INVENTOR(S) : Kyoichi NAGATA

Page 3 of 3

It is certified that error appears in the above-identified patent and that said Letters Patent is hereby corrected as shown below:

In the drawings, Sheet 9, Fig. 8, should illustrate the N-channel transistor 2' as shown below and as indicated in the amended drawings filed July 15, 1999.